United States Patent
Kobayakawa et al.

(10) Patent No.: US 6,709,892 B2
(45) Date of Patent: Mar. 23, 2004

(54) ELECTRONIC DEVICE FABRICATION METHOD COMPRISING TWOFOLD CUTTING OF CONDUCTOR MEMBER

(75) Inventors: Masahiko Kobayakawa, Kyoto (JP); Masahide Maeda, Kyoto (JP); Hiromu Kusunoki, Kameoka (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 10/241,364

(22) Filed: Sep. 10, 2002

(65) Prior Publication Data

US 2003/0071365 A1 Apr. 17, 2003

(30) Foreign Application Priority Data

Sep. 11, 2001 (JP) ........................ 2001-275636

(51) Int. Cl.⁷ .......................... H01L 21/48; H01R 43/00
(52) U.S. Cl. ..................... 438/111; 438/112; 438/113; 438/123; 438/127; 438/462; 29/827; 29/855
(58) Field of Search .................. 438/22, 23, 26, 438/33, 48, 106, 107, 109–113, 121, 123–127, 460–462, 342, 365–369, 375, 377, 380; 257/666, 669, 670, 672, 674, 676, 678, 687

(56) References Cited

U.S. PATENT DOCUMENTS 6,025,640 A * 2/2000 Yagi et al. ................ 257/666
6,307,253 B1    10/2001 Yamamoto ............... 257/666
6,400,004 B1 *  6/2002 Fan et al. .................. 257/666
6,580,161 B2 *  6/2003 Kobayakawa ............. 257/676
6,608,366 B1 *  8/2003 Fogelson et al. .......... 257/666
6,611,047 B2 *  8/2003 Hu et al. .................. 257/666
6,624,007 B2 *  9/2003 Kobayakawa et al. ...... 438/123

FOREIGN PATENT DOCUMENTS

JP    61008960 A  *  1/1986  ........... H01L/23/48
JP    61051862 A  *  3/1986  ........... H01L/23/48

* cited by examiner

Primary Examiner—Alonzo Chambliss
(74) Attorney, Agent, or Firm—Merchant & Gould P.C.

(57) ABSTRACT

A fabrication method for an electronic device includes four steps. The first step is for preparing a leadframe with first and second conductive members. The second step is for connecting a first and a second electronic chips to the first and the second conductive members, respectively. For the third step, the first chip is enclosed by a first resin package allowing partial exposure of the first conductive member, while the second chip by a second resin package spaced from the first package. For the fourth step, the exposed part of the first conductive member is cut. The cutting is performed using first and second tools, where the first tool makes an indentation in the exposed part on a first side. On another side opposite to the first side, the second tool makes a full cut to be linked with the indentation.

9 Claims, 17 Drawing Sheets

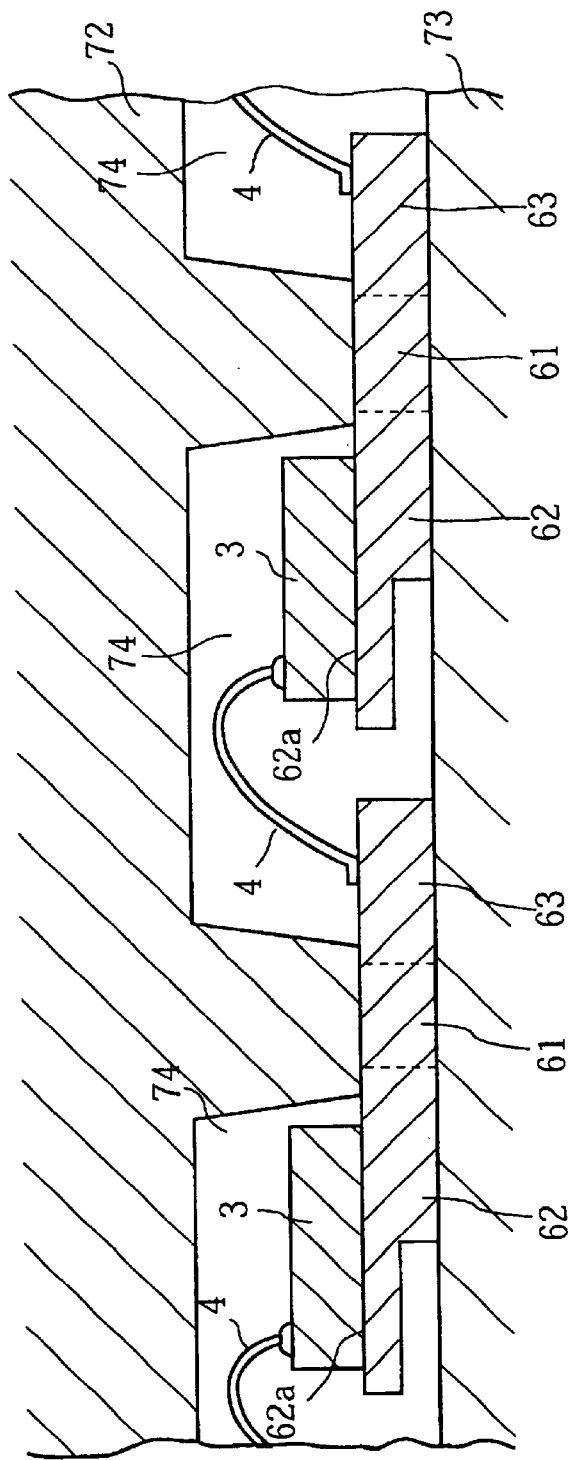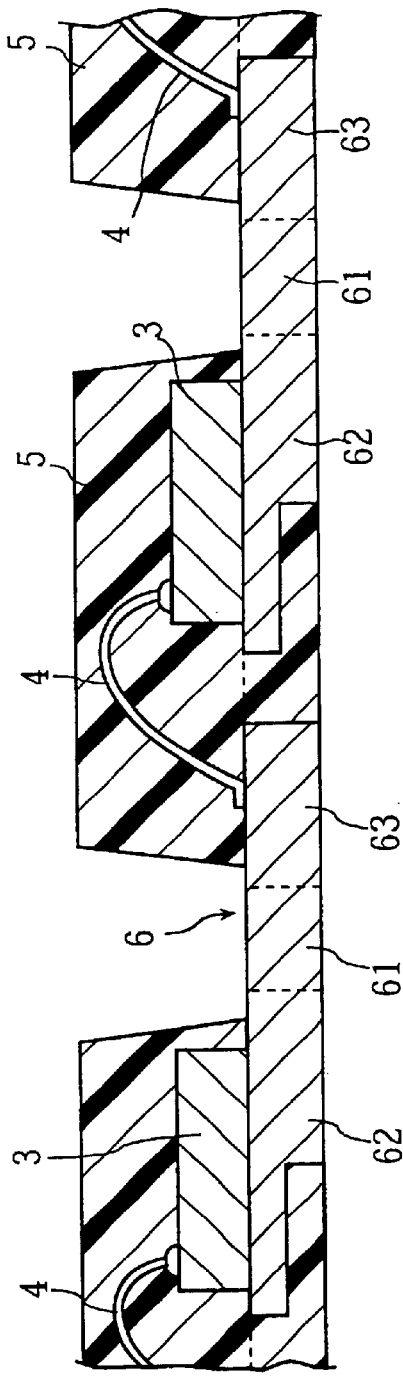
FIG.8A
FIG.8B

ELECTRONIC DEVICE FABRICATION METHOD COMPRISING TWOFOLD CUTTING OF CONDUCTOR MEMBER

BACKGROUND OF THE INVENTION

1. Field of the Invention

The present invention relates to a method of making packaged electronic devices.

2. Description of the Related Art

To provide a semiconductor device of a surface-mount type, conductors as a terminal may be partially exposed in the bottom surface of a resin package. As is known, such a semiconductor device can be produced collectively using a leadframe. A leadframe may be provided with a number of semiconductor device-forming regions, in each of which a semiconductor chip is placed. The respective semiconductor chips are subjected to wire-bonding, and then the chips are resin-packaged. Finally, cuts are made between the semiconductor device-forming regions by using cutting means such as a punch press or a rotary blade, to provide separate resin-packaged semiconductor devices.

As shown in FIG. 16, for example, the resin-packaging may be performed so as to enclose a plurality of semiconductor chips 90 by a common resin coating layer 91. To obtain semiconductor devices as the final products, both the coating layer 91 and the frame 93 need to be cut by a cutting tool 92. In this manner, however, many burrs will be produced when the coating layer 91 is cut. In addition, the production cost tends to become unduly high since resin material needs to be supplied not only to the portions for forming the final resin packages but also to the other wasted portions.

Alternatively, as shown in FIG. 17, the resin-packaging may be performed in a manner such that the semiconductor chips 90 are enclosed individually by separate resin packages 91A. In this case, the cutting tool 92 does not need to cut the resin packages 91A, and the resin material for forming the package is supplied only to the non-wasted portions. Thus, the above-mentioned problems regarding the burrs and the increased production cost do not arise. By this method, however, the following problems will arise.

In order to make compact the semiconductor device, the cutting for the frame 93 should be performed at a position as adjacent to the resin package 91A as possible. For proper processing, as shown in FIG. 17, the frame 93 needs to be pressed against the die 94 by a guide presser (stripper) 95, so that no external force is exerted on the semiconductor chips 90 and that the frame 93 is not detached from the resin packages 91A. As seen from the figure, the guide presser 95 is provided with a recess to accommodate the resin package 91A and a tapering wall to be brought into contact with the frame 93. The presser 95 needs to be made strong enough to permit the frame 93 to be pressed against the die 94 with an appropriate force. To this end, the presser 95 cannot be too thin, particularly in the tapering wall. In the presence of such dimensional requirements, the gap between the cutting tool 92 and the resin package 91A becomes greater than desired due to the intervention of the tapering wall, which is disadvantageous to the downsizing of the semiconductor device.

Further, the method illustrated in FIG. 17 will produce burrs B on the bottom surface of the frame 93 since the frame 93 is cut by a non-stop downward movement of the cutting tool 92. Disadvantageously, the burrs B may be mixed in the solder material applied between the semiconductor device and a circuit board, thereby making the connection less stable.

SUMMARY OF THE INVENTION

The present invention has been proposed under the circumstances described above. It is, therefore, an object of the present invention to provide a method of making a non-defective electronic device with a resin package from which terminal conductors project slightly.

According to the present invention, an electronic device is made in the following manner. First, a leadframe including a first conductive member and a second conductive member is prepared. A first electronic element is connected to the first conductive member, and a second electronic element is connected to the second conductive member. A first resin package is formed for enclosing the first electronic element in a manner allowing exposure of a part of the first conductive member, while a second resin package is formed for enclosing the second electronic element which is spaced apart from the first resin package. Then, the exposed part of the first conductive member is cut. In this cutting procedure, a first tool is used for forming an indentation in the above-mentioned exposed part on a first side of the exposed part, while a second tool is used for making a full cut in the exposed part on a second side opposite to the first side. The full-cut is continued until the resultant cut is linked with the indentation.

By the above method, a preliminary indentation is formed when the conductive member is to be cut. When a full cut is made in the conductive member in a manner such that the full cut extends to be linked with the indentation, the desired cutting for the conductive member can be performed without exerting an unduly great force on the cutting tool (and hence on the conductive member).

Preferably, the indentation may be formed adjacent to the first resin package.

Preferably, the full cut may be formed at a position which is farther from the first resin package than the indentation is, so that the above-mentioned exposed part has a stepped edge.

Preferably, the indentation and the first resin package may be spaced apart from each other by a distance ranging from 10 μm to 100 μm.

Preferably, the first resin package may include a bottom surface brought into contact with a circuit board and also include a side surface extending upward from the bottom surface, the above-mentioned exposed part projecting from the side surface.

Preferably, the indentation formed in the first conductive member may be disposed on the side of the bottom surface of the first resin package.

Preferably, the first conductive member may also be exposed in the bottom surface of the first resin package.

Preferably, the indentation may comprise an upright surface and another surface, the upright surface being closer to the side surface of the first resin package than said another surface is.

Preferably, the indentation may comprise a notch having a V-shaped cross section.

Preferably, each of the first tool and the second tool may comprise a punch.

Other features and advantages of the present invention will become apparent from the detailed description given below with reference to the accompanying drawings.

BRIEF DESCRIPTION OF THE DRAWINGS

FIGS. 8A–8B illustrate a resin-packaging step;

DETAILED DESCRIPTION OF THE PREFERRED EMBODIMENTS

Preferred embodiments of the present invention will be described below with reference to the accompanying drawings.

Figure 1:
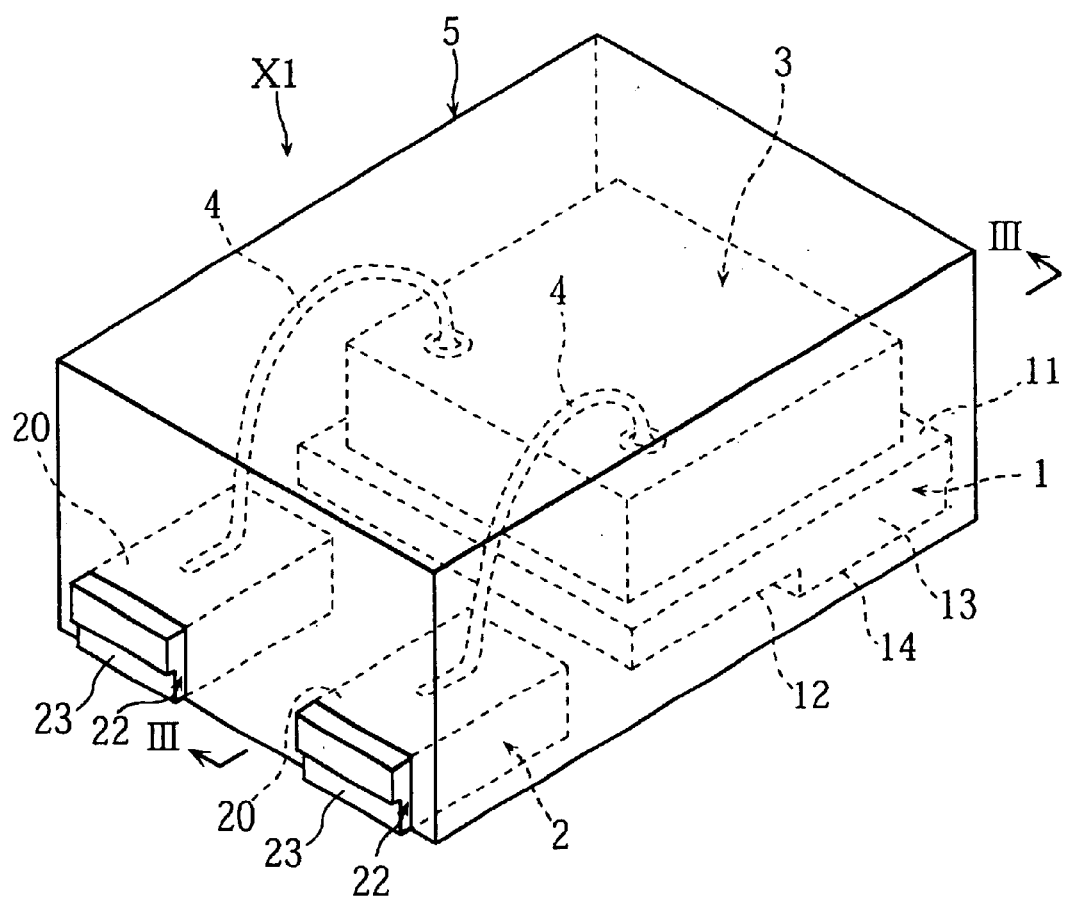
FIG. 1 is a perspective view showing a semiconductor device made by a method of the present invention.
Figure 2:
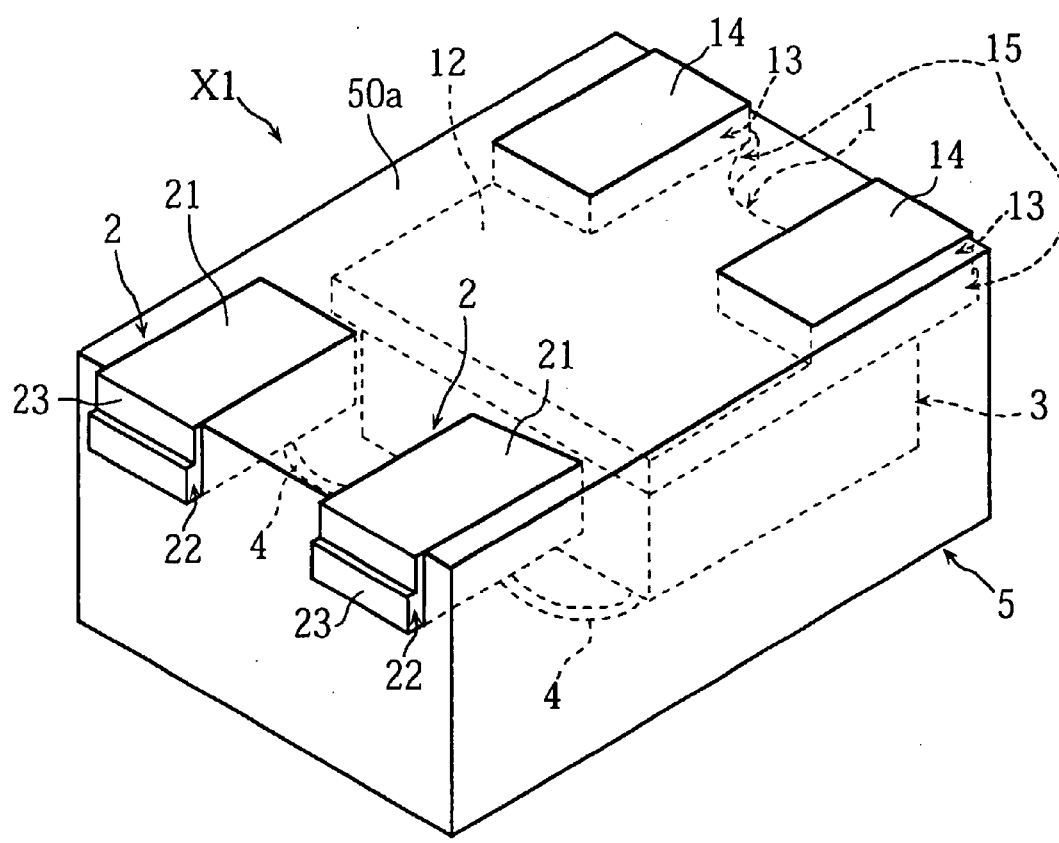
FIG. 2 is a perspective view showing the bottom side of the semiconductor device of FIG. 1.
Figure 3:
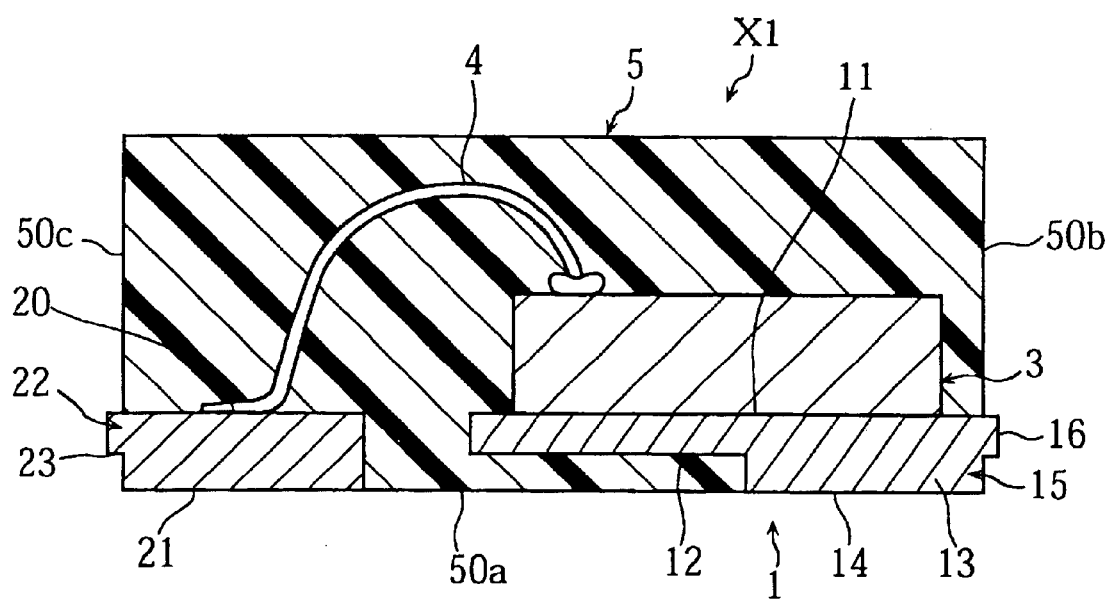
FIG. 3 is a sectional view taken along lines III—III in FIG. 1.

FIGS. 1–3 show an example of a semiconductor device to which a fabrication method of the present invention is applied. The illustrated semiconductor device X1 includes a first conductor 1, a pair of second conductors 2, a semiconductor chip 3, two wires 4 and a resin package 5.

The first conductor 1 has a flat first surface 11 and a second surface 12 formed with two projections 13. Each projection 13 includes a terminal surface 14 exposed in the bottom surface 50a of the resin package 5. The first conductor has an end portion 15 projecting slightly (e.g. 10–100 μm) from a side surface 50b (see FIG. 3). The end portion 15 has a stepped edge 16, its upper half projecting beyond the lower half.

Each second conductor 2 has a first (upper) surface 20 and a second (lower) surface 21 both of which are flat. The second surface 21 is exposed in the bottom surface 50a of the package 5, to serve as a terminal surface. Each second conductor 2 has an end portion 22 projecting slightly (e.g. 10–100 μm) from a side surface 50c of the package 5. The end portion 22 has a stepped edge 23, its upper half projecting beyond the lower half.

Though not shown in the figures, the upper and the lower surfaces of the semiconductor chip 3 are provided with an upper and a lower electrodes. The semiconductor chip 3 is mounted on the first surface 11 of the first conductor 1 via an electroconductive material (such as solder paste or silver paste). In this way, the lower electrode of the chip 3 is electrically connected to the first conductor 1. On the other hand, the upper electrode of the chip 3 is connected to the first surfaces 20 of the respective second conductors 2 via wires 4.

The resin package 5 encloses the semiconductor chip 3 and the wires 4. In the bottom surface 50 of the package 5, as noted above, the terminal surfaces 14 and 21 are exposed. This arrangement makes the semiconductor device X1 surface-mountable to e.g. a printed circuit board.

Figure 4:
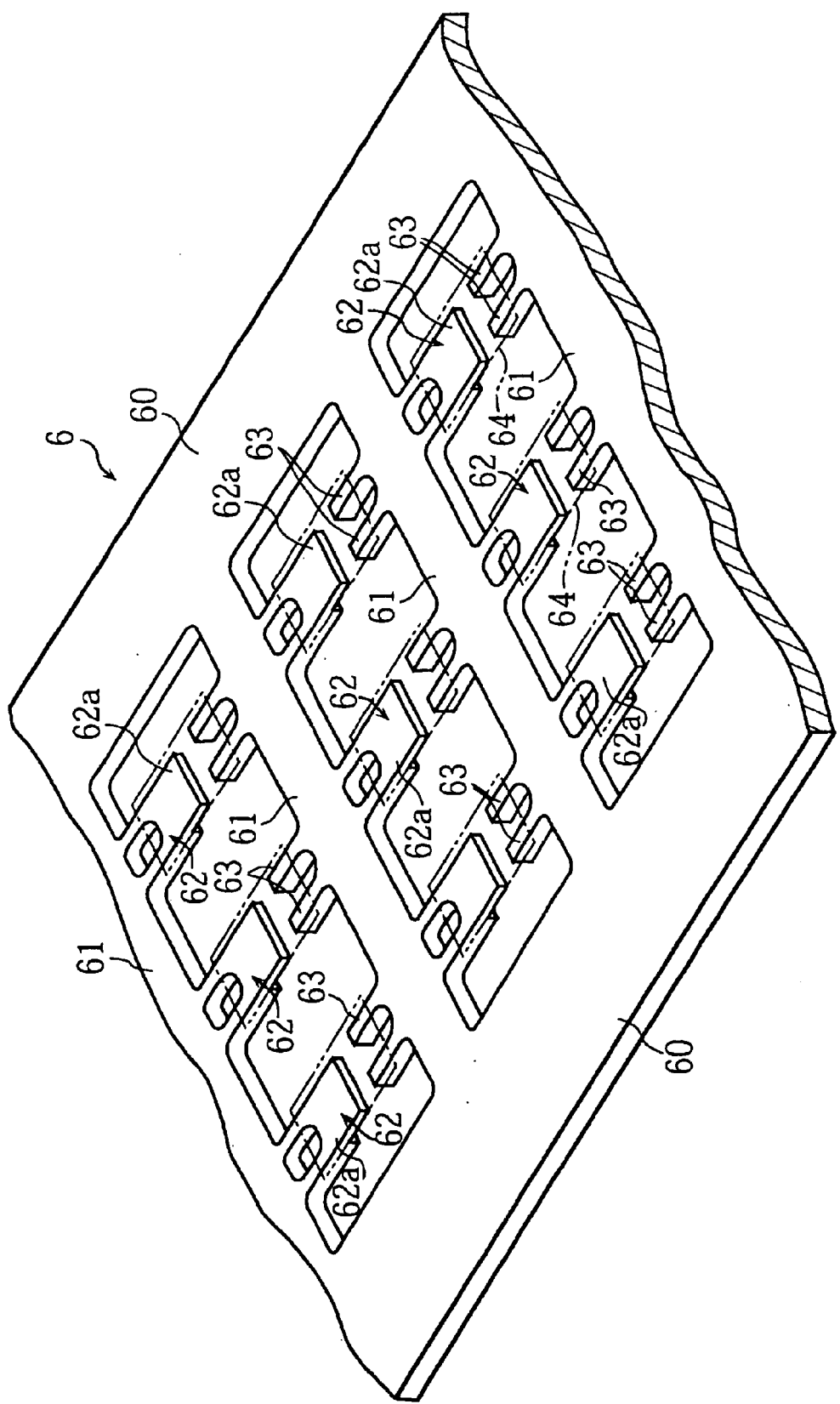
FIG. 4 is a perspective view showing the upper side of a leadframe used for the fabrication method of the present invention.
Figure 5:
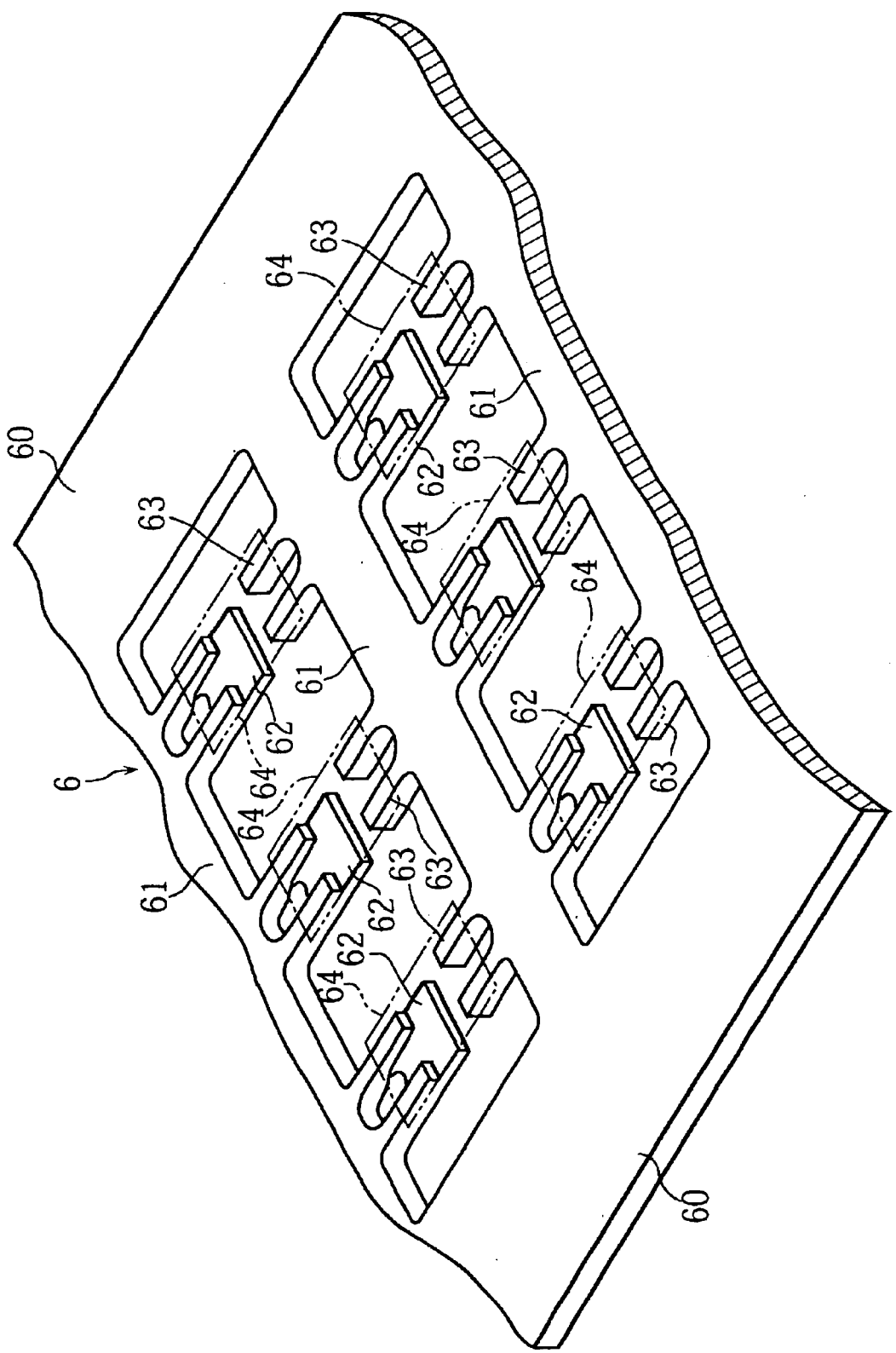
FIG. 5 is a perspective view showing the lower side of the leadframe used for the fabrication method of the present invention.

The semiconductor device X1 may be made by utilizing a leadframe shown in FIGS. 4 and 5. FIG. 4 is a perspective view showing principal parts of the leadframe as seen from the upper side, while FIG. 5 is a perspective view showing the principal parts of the leadframe as seen from the lower side.

The leadframe 6 includes a pair of elongated side members 60 and a number of cross members 61 bridging between the paired side members 60. Each cross member 61 is formed with a plurality of first conductive members 62 extending toward one of the adjacent cross members 61, and with a plurality of second conductive members 63 extending toward the other adjacent cross member 61. The first and the second conductive members 62, 63 are formed into the first and the second conductors 1, 2 of the semiconductor device X1 shown in FIGS. 1–3. The first conductive member 62 can be divided into a thick-walled portion that provides the terminal surface 14 of the device X1 and the remaining portion which is relatively thin. In the leadframe 6, there are particular regions (semiconductor device forming regions) 64 between adjacent cross members 61 (see the double-dot chain lines). Each of these region is provided with a pair of first and second conductive members 62, 63 from which a semiconductor device X1 is produced.

Figure 6:
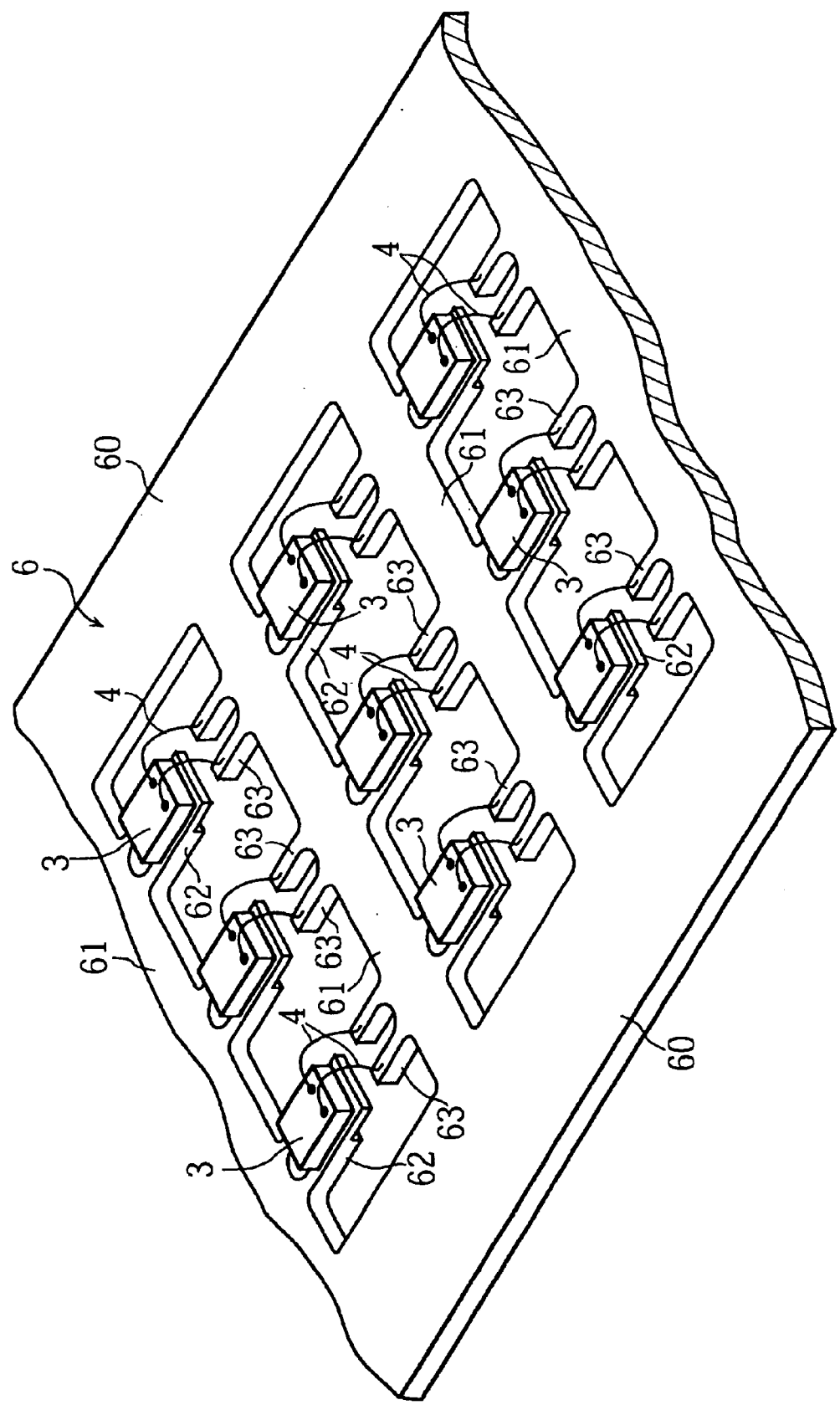
FIG. 6 is a perspective view showing the arrangement of semiconductor chips mounted on the leadframe.

Onto the leadframe 6, a plurality of semiconductor chips 3 are die-bonded. Then, wire-bonding is performed between the respective chips 3 and the leadframe 6, so that the chips 3 are electrically connected to the frame 3, as shown in FIG. 6.

Figure 7A:
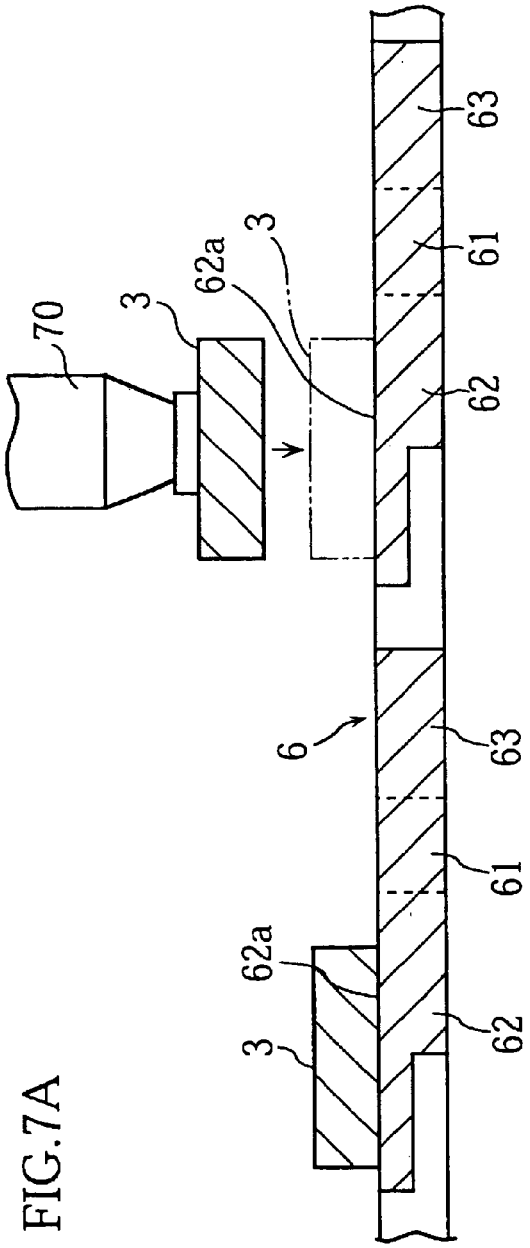
FIG. 7A illustrates a die-bonding step for semiconductor chips.

More specifically, the die-bonding of the semiconductor chips 3 is performed in the following manner. First, solder paste is applied to the lower electrodes of the respective chips 3. As shown in FIG. 7A, each semiconductor chip 3 is mounted to the upper surface 62a of the relevant first conductive member 62 of the frame 6 by using a suction collet 70. Then, the applied solder paste is melted in a furnace. Finally, the molten solder is cooled to solidify for fixing the semiconductor chips 3 to the respective first conductive members 62.

Figure 7B:
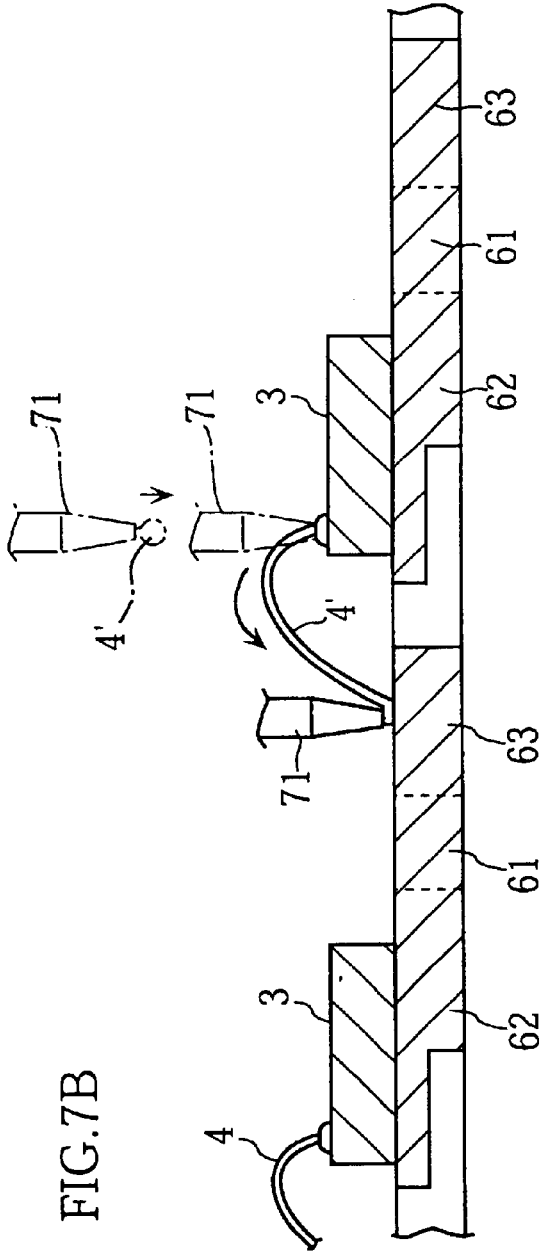
FIG. 7B illustrates a wire-bonding step.

The wire-bonding may be performed by using an existing wire-bonding machine. Specifically, referring to FIG. 7B, the tip of wire 4' is drawn out from a capillary 71 and melted. The tip of the wire 4' is pressed onto the upper electrode of the target semiconductor chip 3. Then, the capillary 71 is moved accordingly as the wire 4' is being paid out from the capillary 71. Finally, the capillary 71 presses the wire 4' onto the second conductive member 63 for fixation and consecutive cutting of the wire 4'.

Figure 9:
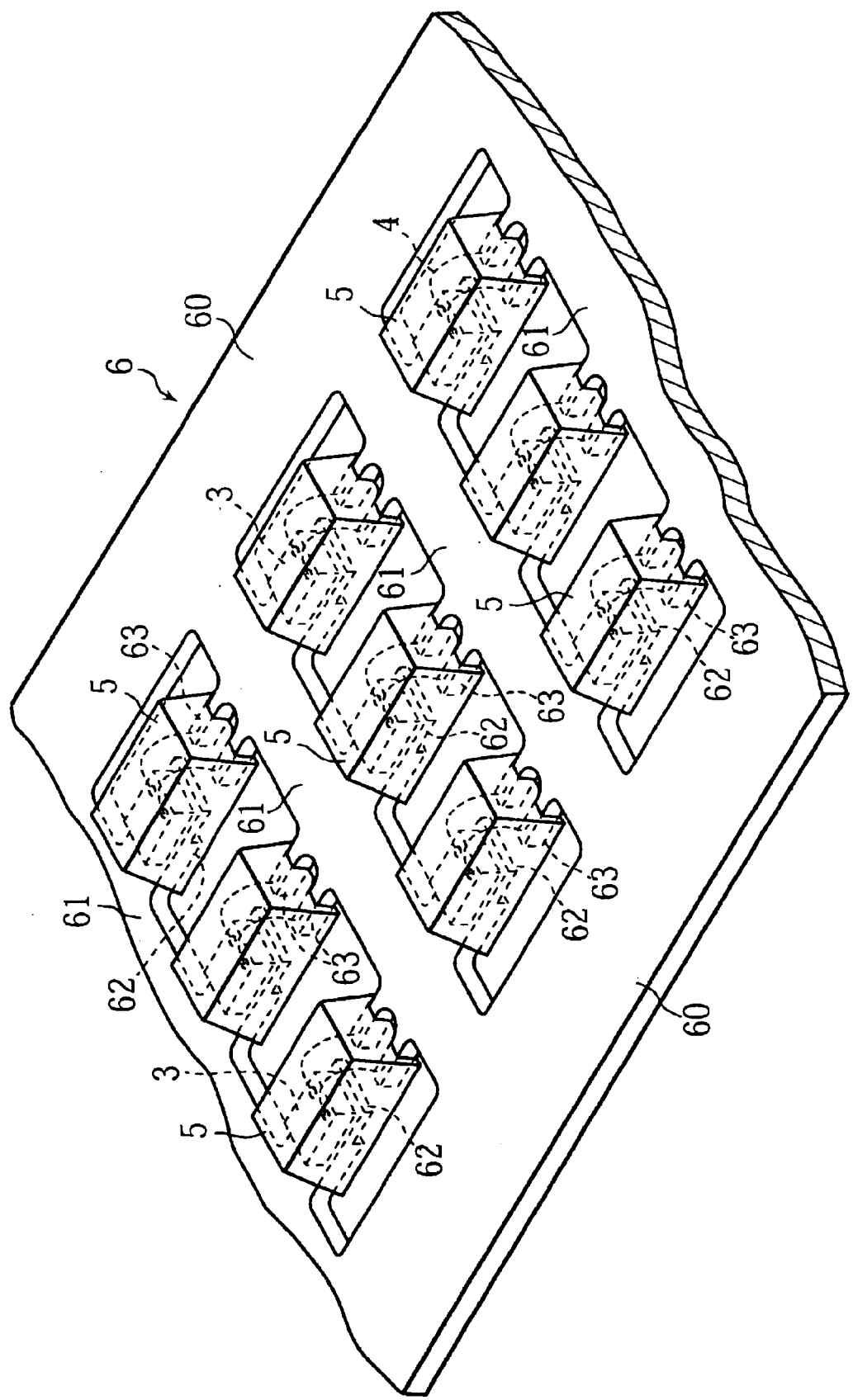
FIG. 9 is a perspective view showing the resin packages formed for the respective semiconductor chips mounted on the leadframe.

Then, the resin packages 5 are formed to cover the individual semiconductor chips 3 separately. To this end, referring to FIG. 8A, use is made of a pair of upper and lower molding members 72, 73 that forms a plurality of cavities 74 in which the semiconductor chips 3 are separately accommodated. A molten thermosetting resin is poured into the cavities 74 and then hardened by heating. Finally, the upper and the lower molding members 72, 73 are separated. This produces the resin packages 5 enclosing the individual chips 3, as shown in FIGS. 8B and 9.

Then, the first and the second conductive members 62, 63 are cut at a position very close to the resin package 5, so that product semiconductor devices X as shown in FIGS. 1–3 are obtained. As will be described below, the cutting procedure for the first and the second conductive members 62, 63 includes a preliminary cutting step (indentation forming step) and a full-cutting step.

Figure 10:
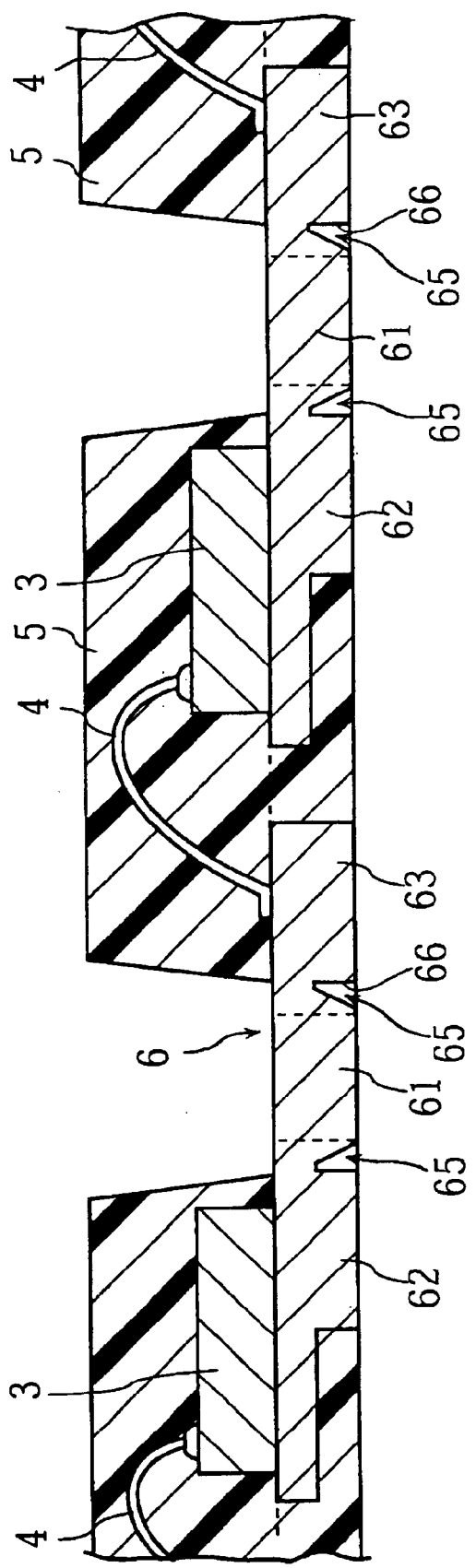
FIG. 10 is a sectional view illustrating indentations formed in the leadframe.
Figure 11:
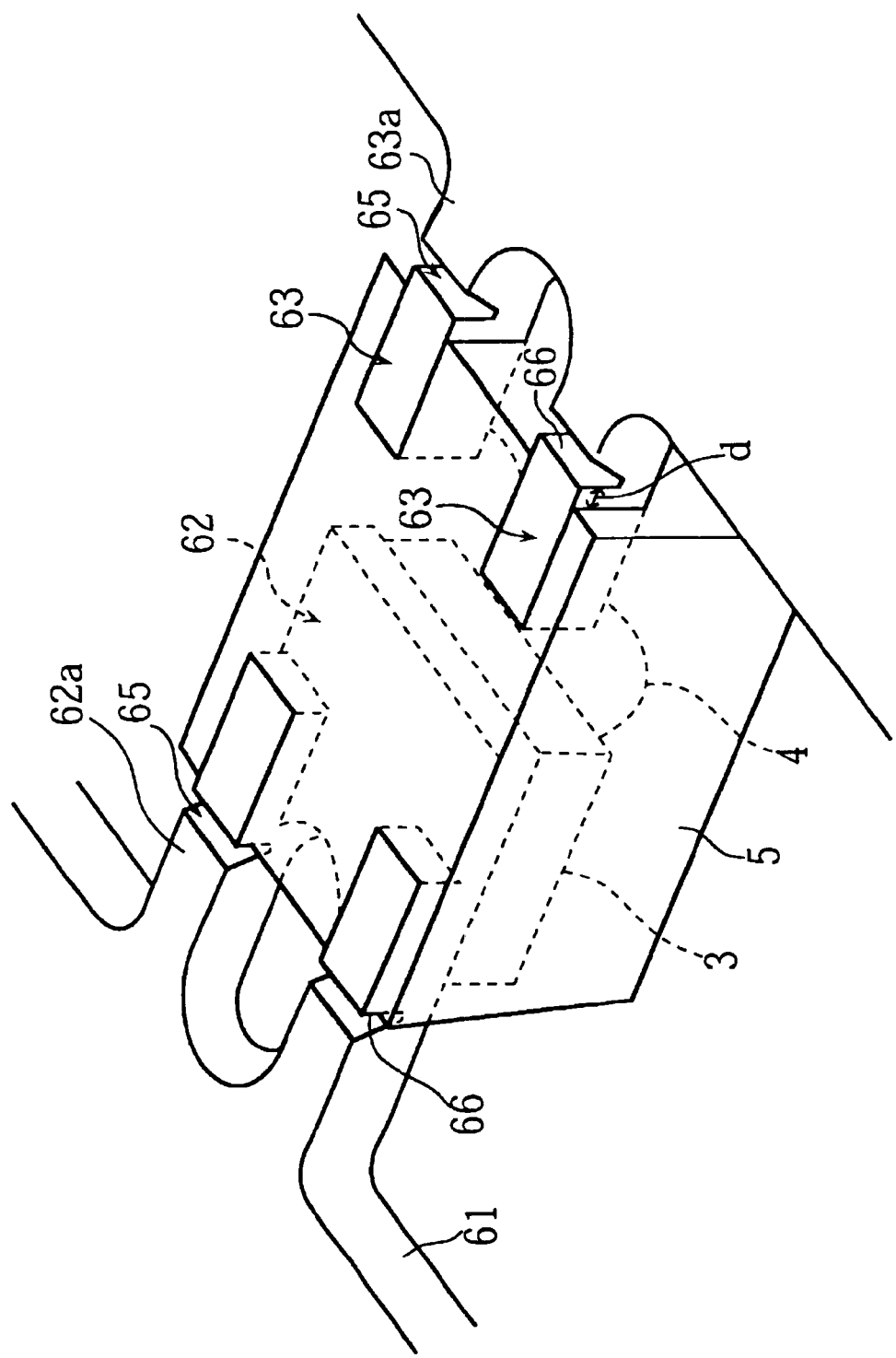
FIG. 11 is a perspective view showing the bottom side of the leadframe with the indentations.

For the preliminary cutting step, as shown in FIGS. 10 and 11, the first and the second conductive members 62, 63 are formed with indentations 65 on the side of the lower surfaces 62a, 63a. The indentations 65 are located close to the resin package 5, with a distance d (see FIG. 11) ranging from 10 μm to 100 μm. The illustrated indentations 65, V-shaped in cross section, have an upright surface 66 located near the resin package 5 (see also FIG. 10).

Figure 12:
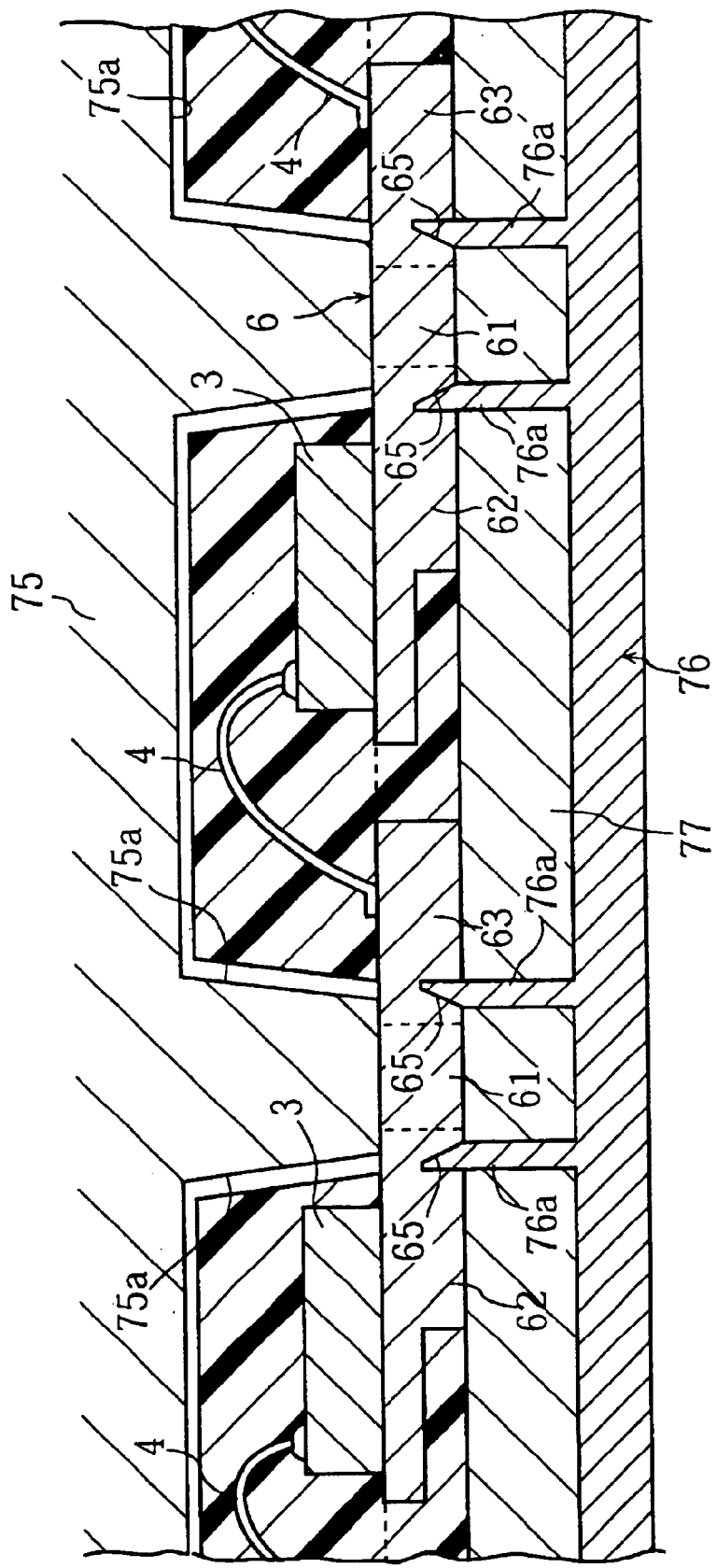
FIG. 12 illustrates a step for forming the indentations.

Referring to FIG. 12, the indentations 65 may be formed by using a die 75 and a punch 76. The die 75 is formed with hollows 75a corresponding in position to the resin packages 5. The hollows 75a are larger than the packages 5. Thus, each hollow 75a can accommodate the resin package 5 with a sufficient clearance when the die 75 is laid over the leadframe 6. This clearance permits the die 75 to press on the upper side of the frame 6 without interfering with the packages 5. The punch 76 is provided with a plurality of chisel members 76a. The chisel members 76a are grouped into a number of pairs in each of which two adjacent chisels members are spaced from each other by a distance slightly greater than the corresponding size of the resin package 5. These pairs are arranged in the longitudinal direction (see FIG. 4) of the side members 60.

To form the indentations 65 in the frame 6, the chisel members 76a of the punch 76 are forced into the bottom of the frame 6, with the die 75 held in pressing contact with the upper surface of the frame 6. In this process, the punch 76 is operated with a stripper 77 intervening. As a result, the indentations can be formed at the intended positions in the frame 6. Further, it is possible to control the penetration of the chisel members 76a (so that the intended depth of the resultant indentations is attained) and also to keep the leadframe 6 in place.

Figure 13:
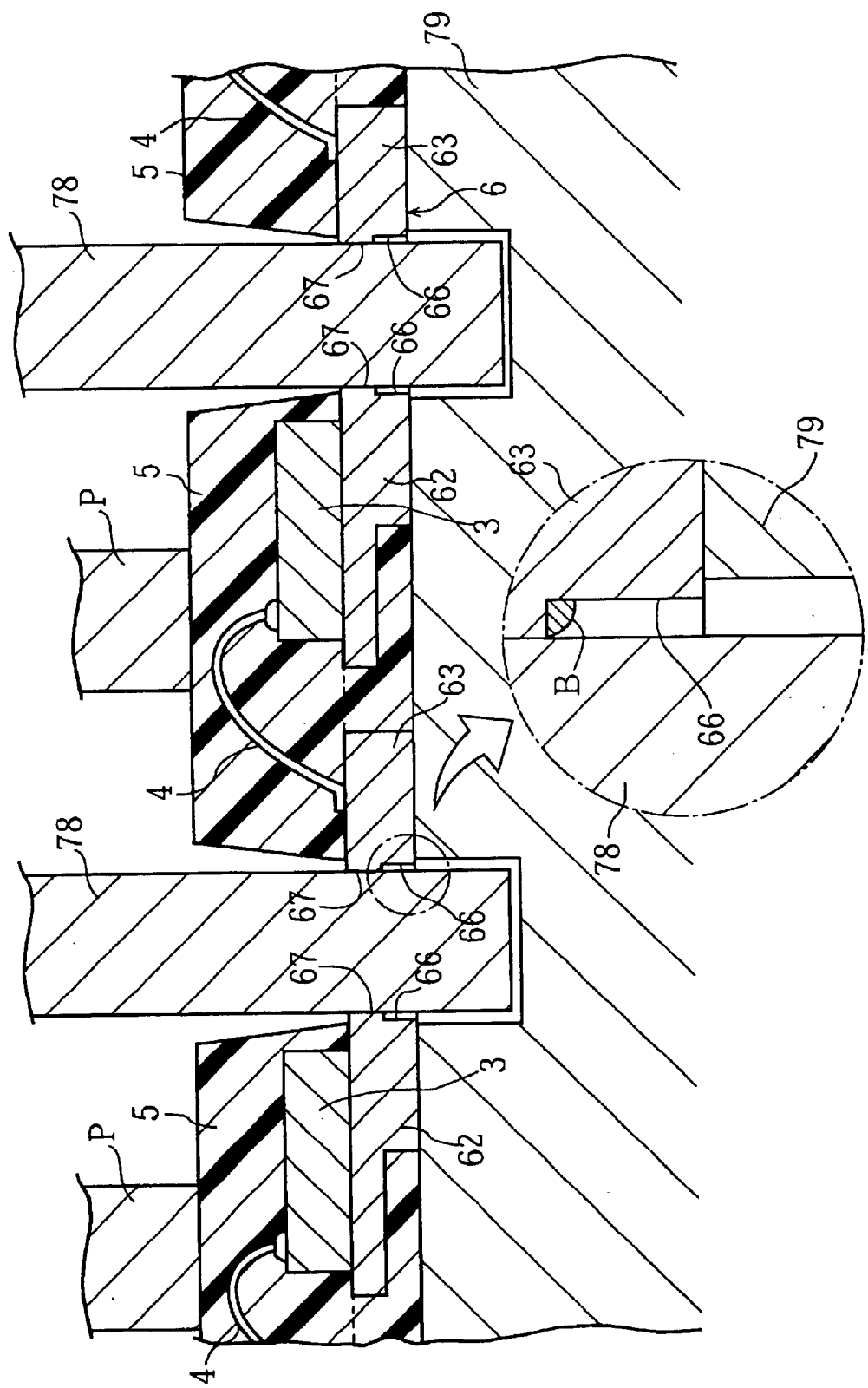
FIG. 13 illustrates a full-cutting step.

For the full-cutting step, use may be made of existing cutting tools such as a punch and a rotary blade. FIG. 13 shows an instance where punches 78 are used. As seen from the figure, each punch 78 has a thickness which is slightly smaller than the distance between the adjacent resin packages 5. More precisely, the thickness is slightly smaller than the distance between the upright surfaces 66 of the adjacent indentations 65. The full-cutting is performed to cut the first and the second conductive members 62, 63 completely by working the punch 78 onto the upper surface of the frame 6 placed on the die 79. Preferably a pin P may be held in pressing contact with the semiconductor chip 3 during the cutting procedure. As a result of the cutting, the semiconductor device X1 is obtained.

According to the above-described method, the punch 78 only needs to cut a thinner portion than when no indentations 65 are formed. This permits the first and the second conductive members 62, 63 to be cut more easily, with no strong force being exerted. Thus, even when no stripper is used to hold the leadframe 6, the conductive members 62, 63 can be cut properly even at positions adjacent to the resin package 5. Accordingly, it is possible to make extremely small the projection of the resultant first and second conductors 1, 2 from the resin package. Further, since the conductive members 62, 63 are cut with a small force, it is possible to alleviate or even fully overcome the problem of detachment of the conductive members from the resin package 5 during the cutting process.

In the above method, the thickness of the punch 78 is smaller than the distance between the upright surfaces 66 of the adjacent indentations 65. Thus, the cut surface 67 made by the punch 78 is offset from the upright surface 66 (see FIG. 13). This provides stepped edges 16, 23 in the first and the second conductors 1, 2. The stepping configuration of the edges 16 and 23 is advantageous because a burr B made in the full-cutting procedure may be attached to the stepped portion, but not to the terminal surfaces 14, 21 of the conductors 1 and 2. Not being attached to the terminal surfaces of the conductors 1–2, the burr B does not mix in a connecting layer of e.g. solder material. Thus, the first and the second conductors 1, 2 can be reliably connected to a printed circuit board.

Figure 14A:
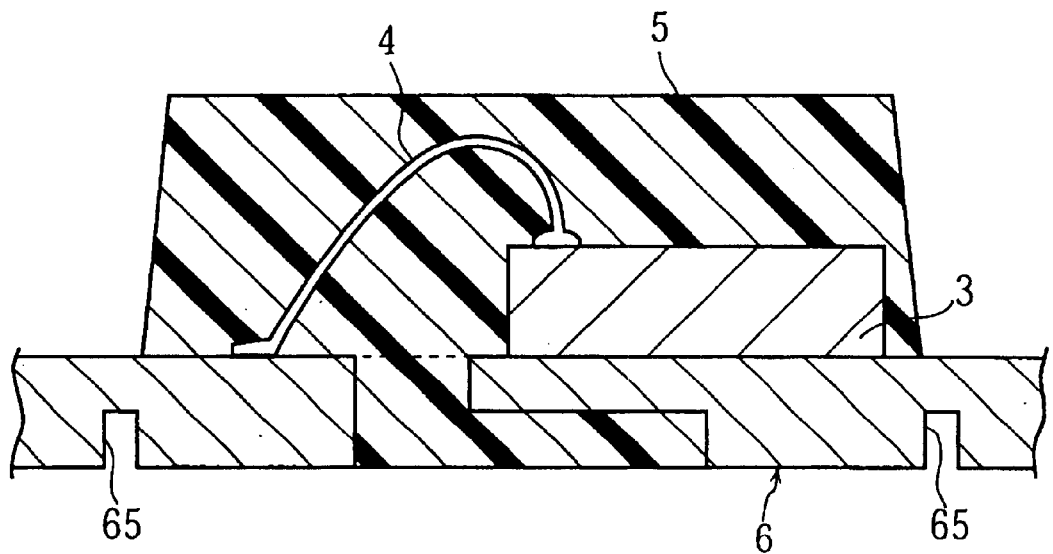
FIG. 14A is a sectional view showing the leadframe formed with indentations of a different type.
Figure 14B:
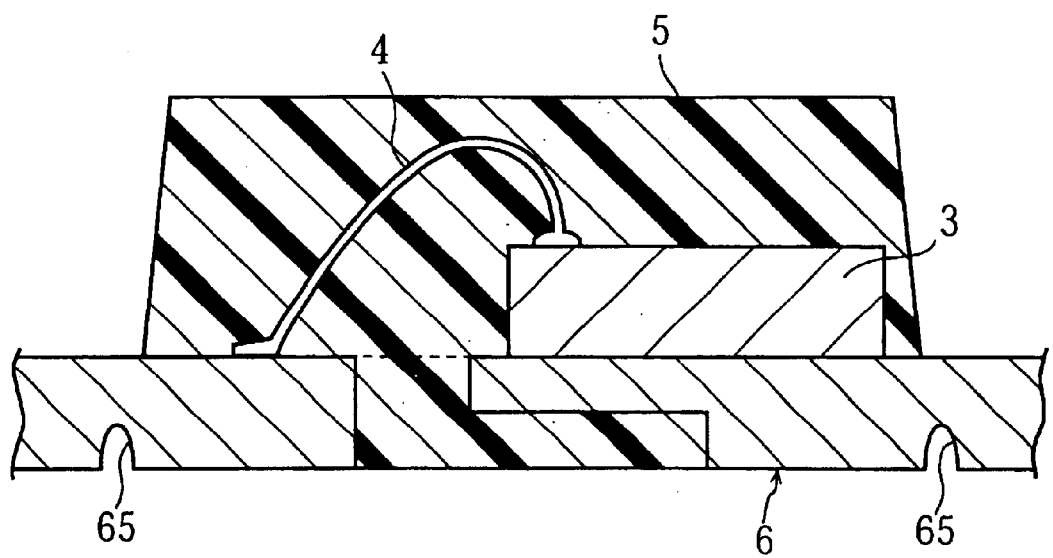
FIG. 14B is a sectional view showing the leadframe formed with indentations of a still different type.

In the above-described embodiment, the leadframe is formed with V-shaped indentations having an upright surface. The present invention is not limited to this particular example. For instance, the cross section of the indentations may be rectangular as shown in FIG. 14A or U-shaped as shown in FIG. 14B.

Figure 15A:
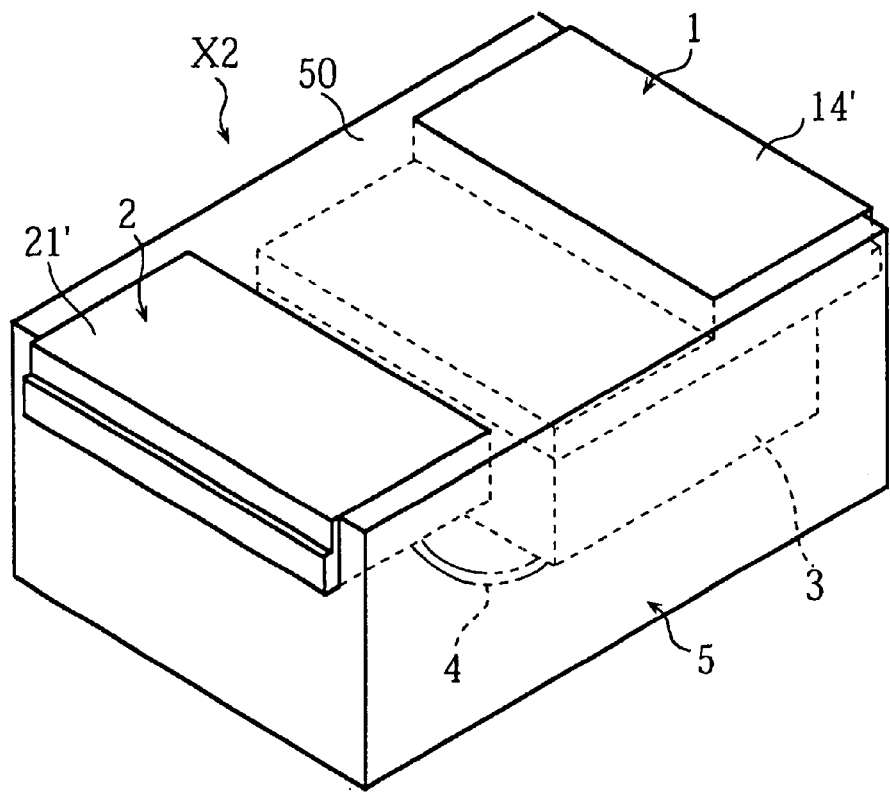
FIGS. 15A–15B are perspective views showing a different example of a semiconductor device made by the method of the present invention.
Figure 15B:
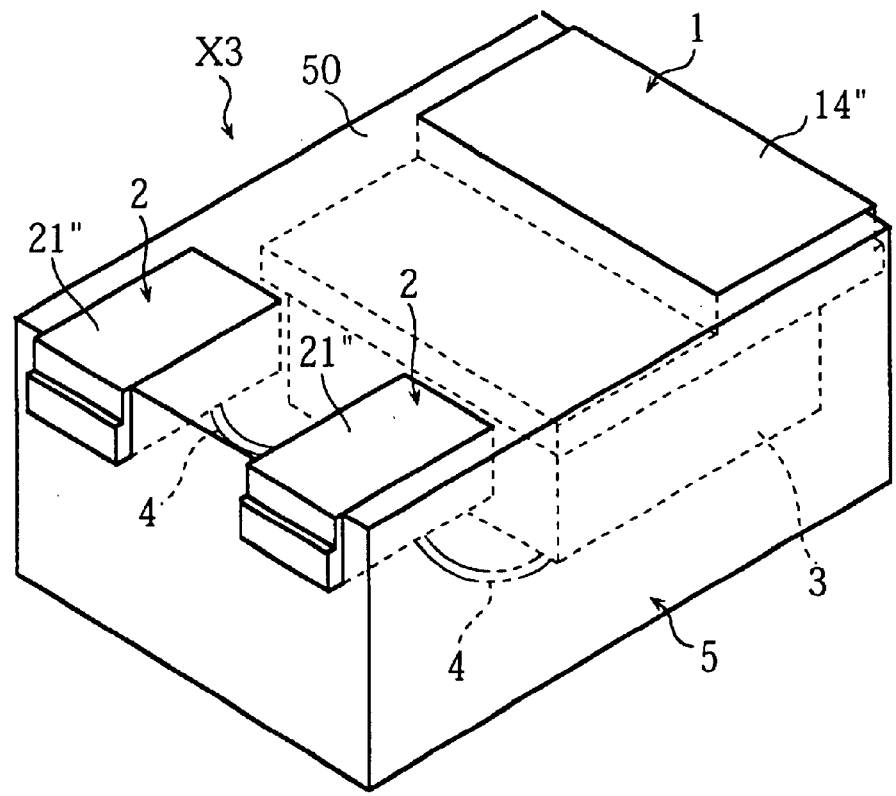
Figure 16:
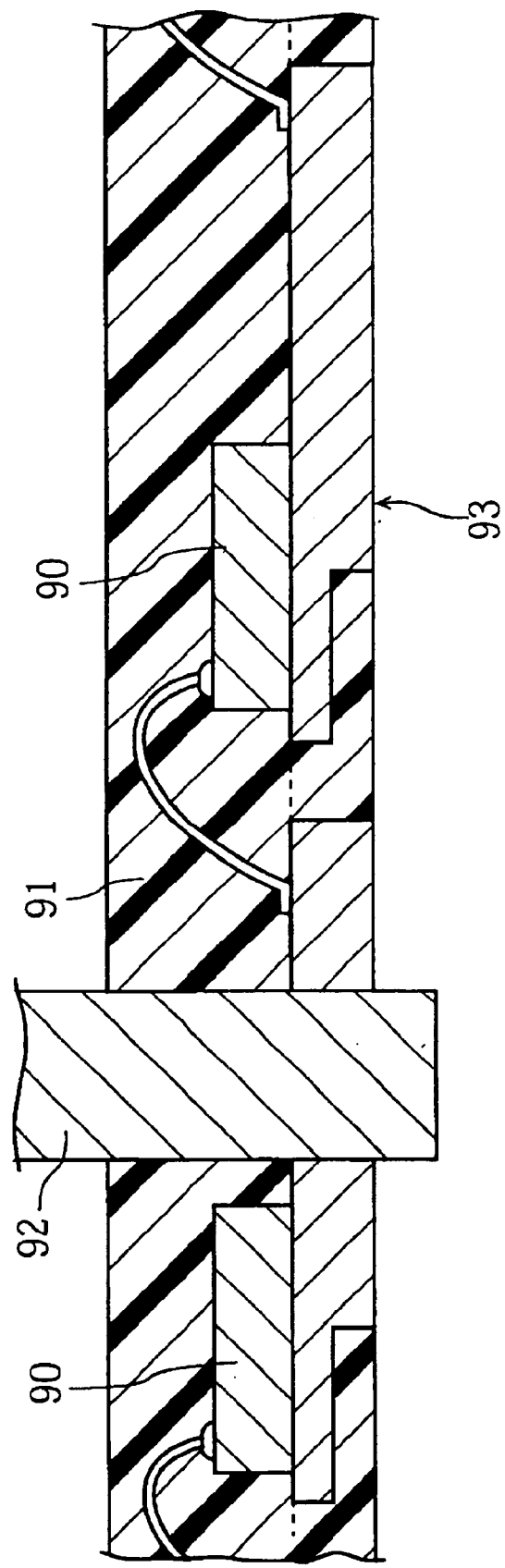
FIG. 16 illustrates a conventional method for cutting a leadframe.
Figure 17:
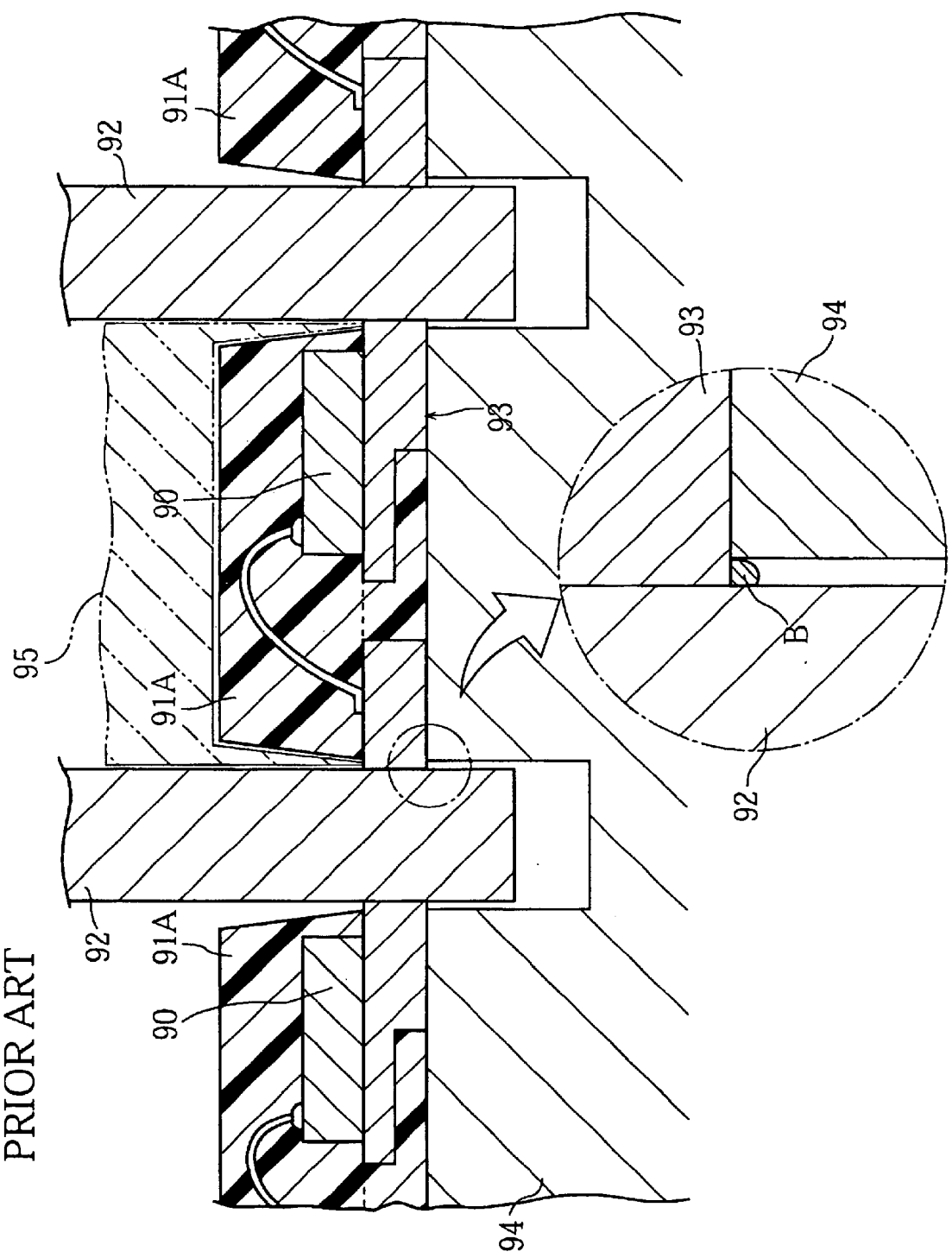
FIG. 17 illustrates another conventional method for cutting a leadframe.

FIG. 15A shows a semiconductor device X2 provided in accordance with the present invention. In this device, two terminal surfaces 14' and 21' are exposed in the bottom surface 50 of the resin package 5. FIG. 15B shows a semiconductor device X3 which is also provided in accordance with the present invention. In this device, three terminal surfaces 14" and 21" are exposed in the bottom surface 50 of the package 5.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A method of making an electronic device, comprising the steps of:
   preparing a leadframe including a first conductive member and a second conductive member;
   connecting a first electronic element to the first conductive member and connecting a second electronic element to the second conductive member;
   forming a first resin package for enclosing the first electronic element in a manner allowing exposure of a part of the first conductive member and forming a second resin package for enclosing the second electronic element, the second resin package being spaced apart from the first resin package; and
   cutting the exposed part of the first conductive member;
   wherein the cutting step employs a first tool for forming an indentation in said exposed part on a first side of said exposed part and a second tool for making a full cut in said exposed part on a second side opposite to the first side so that the full cut is linked with the indentation.

2. The method according to claim 1, wherein the indentation is formed adjacent to the first resin package.

3. The method according to claim 1, wherein the indentation and the first resin package are spaced apart from each other by a distance ranging from 10 μm to 100 μm.

4. The method according to claim 1, wherein the first resin package includes a bottom surface brought into contact with a circuit board and also includes a side surface extending upward from the bottom surface, said exposed part projecting from the side surface.

5. The method according to claim 4, wherein the indentation formed in the first conductive member is disposed on a side of the bottom surface of the first resin package.

6. The method according to claim 4, wherein the first conductive member is also exposed in the bottom surface of the first resin package.

7. The method according to claim 4, wherein the indentation comprises an upright surface and another surface, the upright surface being closer to the side surface of the first resin package than said another surface is.

8. The method according to claim 1, wherein the indentation comprises a notch having a V-shaped cross section.

9. The method according to claim 1, wherein each of the first tool and the second tool comprises a punch.

* * * * *